United States Patent
Mayberry

(10) Patent No.: US 6,875,625 B2
(45) Date of Patent: Apr. 5, 2005

(54) SYSTEM AND METHOD FOR SPLIT PACKAGE POWER AND ROTATIONAL BURN-IN OF A MICROELECTRONIC DEVICE

(75) Inventor: Mike Mayberry, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 162 days.

(21) Appl. No.: 10/405,598

(22) Filed: Apr. 1, 2003

(65) Prior Publication Data

US 2003/0143763 A1 Jul. 31, 2003

Related U.S. Application Data

(62) Division of application No. 09/751,543, filed on Dec. 29, 2000, now Pat. No. 6,670,633.

(51) Int. Cl.[7] .......................... G01R 31/26; H01L 21/66
(52) U.S. Cl. ...................................................... 438/17
(58) Field of Search ............................... 438/14, 15, 17

(56) References Cited

U.S. PATENT DOCUMENTS 6,323,664 B1 * 11/2001 Kim et al. .................. 324/754
6,476,629 B1 * 11/2002 Bjork ......................... 324/765
6,580,283 B1 *  6/2003 Carbone et al. ............ 324/760

* cited by examiner

Primary Examiner—David A. Zarneke
(74) Attorney, Agent, or Firm—Blakely, Sokoloff, Taylor & Zafman LLP

(57) ABSTRACT

A microelectronic device is provided including an integrated circuit mounted to a substrate. A break through multiple conductive layers of the substrate corresponds to a break in the power planes of the integrated circuit. The breaks in the substrate and in the integrated circuit allow for a rotational burn-in of a first portion and a second portion of the integrated circuit.

15 Claims, 3 Drawing Sheets

SYSTEM AND METHOD FOR SPLIT PACKAGE POWER AND ROTATIONAL BURN-IN OF A MICROELECTRONIC DEVICE

This is a Divisional application of Ser. No. 09/751,543, filed Dec. 29, 2000, now U.S. Pat. No. 6,670,633 which is presently pending.

FIELD OF THE INVENTION

The present invention relates generally to burn-in testing of a microelectronic device and, more specifically, to a system and method for rotational burn-in testing of a microelectronic device.

BACKGROUND

Manufacturers of microelectronic devices that contain integrated circuits ("IC's") typically use burn-in testing procedures on the microelectronic devices to test for latent failures that may occur in the IC. One standard testing regimen involves placing microelectronic devices into a burn-in chamber, raising the temperature of the microelectronic devices, and then applying nominal or stress voltages to them. The voltages are usually between 1.0–2.0 times the normal operating voltage of the IC and the stress usually ranges between 3–100 hours.

Current microelectronic devices fit generally within an economical burn-in envelope. Burn-in temperature is adjusted by changing the ambient air temperature and/or adjusting the microelectronic device toggle frequency to change the dynamic power. Unfortunately, high-voltage conditions tend to increase the problem of leakage power in the microelectronic devices. One method of dealing with this problem has been to decrease the toggle rate of the microelectronic devices and also to depopulate the heat chamber to keep within a total heat budget. However, there is no longer much room to decrease the frequency of modern microelectronic devices. Moreover, depopulation does not address the problem of leakage in individual units that can go into thermal runaway.

BRIEF DESCRIPTION OF THE DRAWINGS

The present invention is illustrated by way of example, and not limitation, in the figures of the accompanying drawings in which like reference numerals refer to similar elements and which.

DETAILED DESCRIPTION

Throughout the following description specific details are set forth in order to provide a more thorough understanding of the invention. However, the invention may be practiced without these particulars. In other instances, well known elements have not been shown or described in detail to avoid unnecessarily obscuring the present invention. Accordingly, the specification and drawings are to be regarded in an illustrative rather than a restrictive sense.

The present invention provides a system and method for utilizing split power planes in a substrate and corresponding splits in an integrated circuit ("IC") in a microelectronic device to enable burn-in of parts of the IC in sequence (i.e., separately). The split structure of the microelectronic device achieves the ability to separately power a portion of the IC during internal manufacture but to make the split invisible in the final application.

Unlike depopulation or full device rotational burn-in, each half of the IC has reduced power. This eases the individual power delivery and removal problem. For example, assume nominal parts of the IC are 100 watts and high leakage parts are 200 watts. In a conventional burn-in, the parts may be segregated so that the 100 watt parts go into a full heat chamber while the 200 watt parts go into a depopulated (e.g., half populated) heat chamber. Alternatively, the 200 watt parts may be placed into a full heat chamber but with only half active at one time. These examples all have the same average power, but the individual power delivery and removal mechanisms have to be twice as efficient in the latter two cases. The half load case (i.e., where the 100 watt parts go into a full heat chamber while the 200 watt parts go into a depopulated heat chamber) also incurs extra overhead for heat chamber load and unload.

However, if the microelectronic device was split into two pieces and a rotational burn-in was utilized, then for the 200 watt parts the individual power delivery and removal may be capped within the 100 watt envelope without incurring the overhead of extra loading and unloading into the heat chamber.

Figure 1:
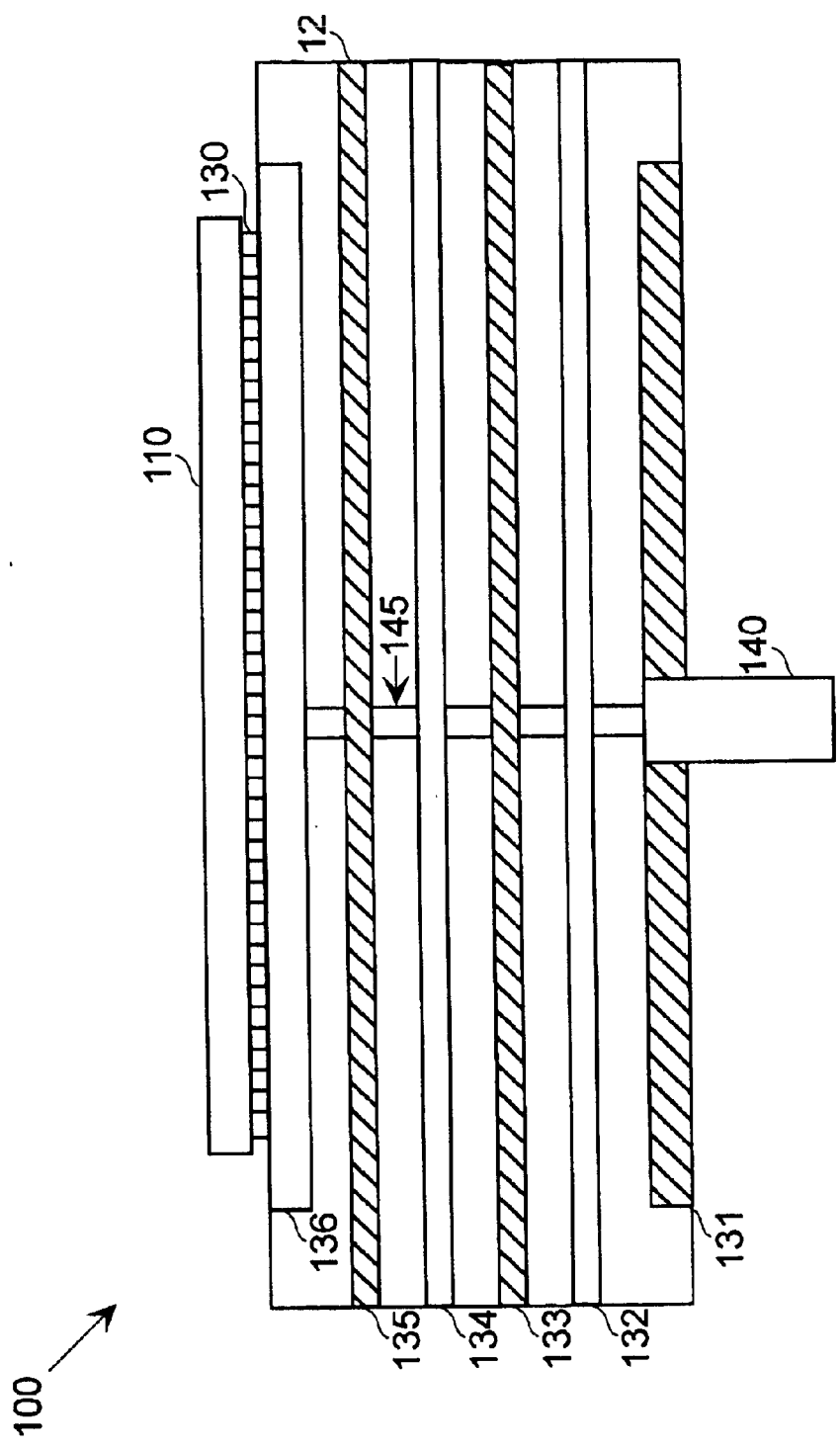
FIG. 1 is a schematic illustration of a conventional microelectronic device.

Referring now to FIG. 1 there is shown a schematic illustration of a conventional microelectronic device 100. An active surface of an IC 110 is bonded directly to conductive traces on a substrate 120 using an array of minute solder bumps 130. As is illustrated in the embodiment of FIG. 1, the substrate contains multiple conductive layers including ground (Vss) 132, 134, and 136 and power (Vss) 131, 133, and 135 planes. A pin or socket 140 is attached to a common power supply or signal generator (not shown in this view) and supplies power to the IC 110 using a circuit path 145 connected to the multiple conductive layers 131, 132, 133, etc. in the substrate 120. While at elevated temperatures (i.e., during burn-in), numerous test patterns and sequences are performed on the IC 110. Also, during burn-in different voltages can be applied for electrically stressing the IC 110 as well known in the art. In this manner, the IC 110 is tested for electrical performance and circuit functioning.

Figure 2:
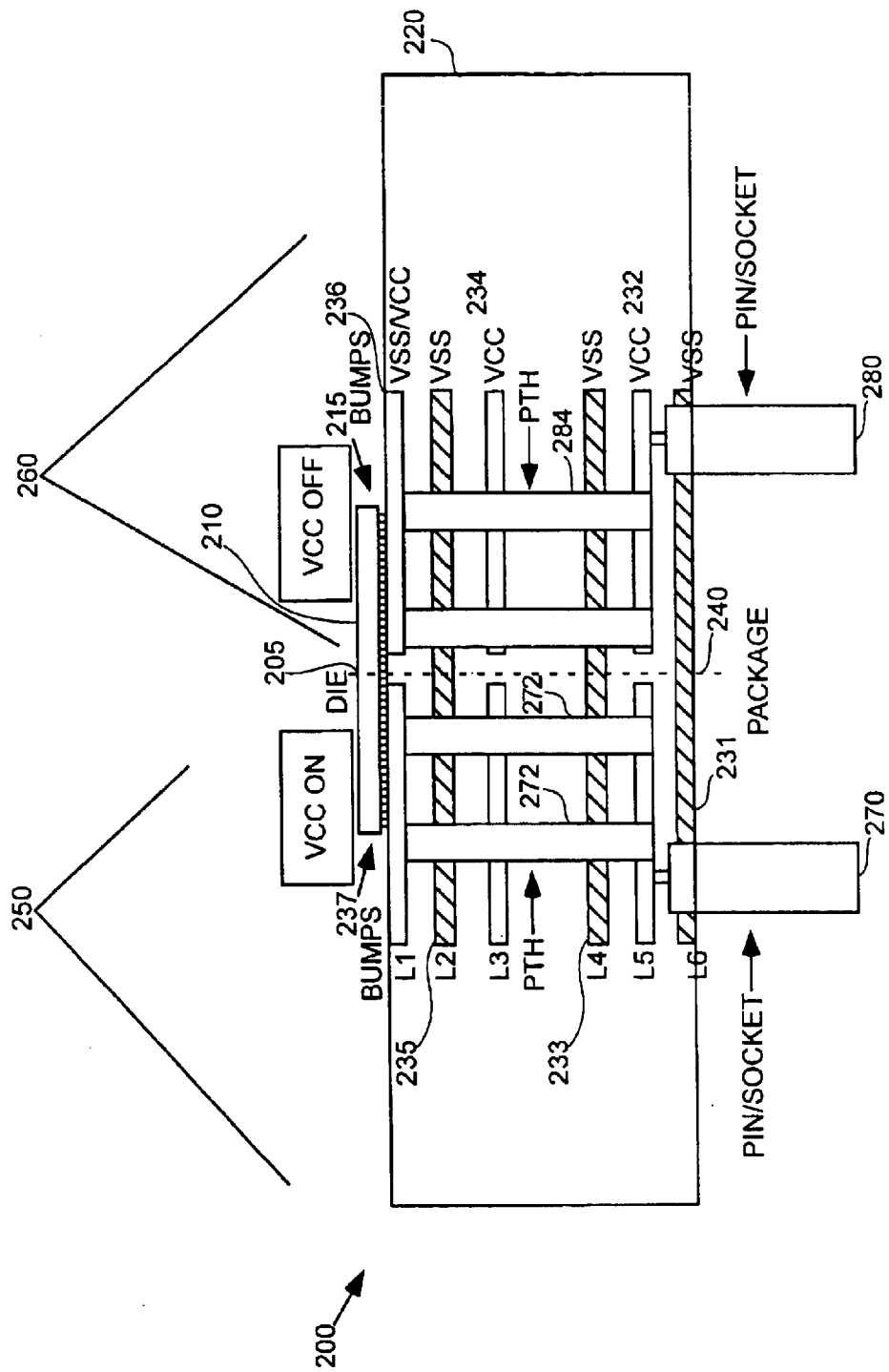
FIG. 2 is a schematic illustration of split power planes in a substrate and corresponding splits in an integrated circuit in a microelectronic device according to one embodiment of the present invention.

Referring now to FIG. 2 there is shown a schematic illustration of split power planes in a substrate and corresponding splits in an IC in a microelectronic device 200 according to one embodiment of the present invention. An IC 210 is provided which has thereon logic circuits and memory array circuits (not shown in this view). It should be appreciated that the IC 210 may be an analog device, a microprocessor, an application specific device, or any other type of IC that may be electrically connected to a substrate 220. The IC 210 power planes (not shown in this view) are fabricated to have a dual core design that includes a horizontal break 205 between the sections. The horizontal break 205 does not affect the functionality of the IC 210 under normal operation and is invisible in the final application. The IC 210 may be mounted to the substrate 220 using conventional methods such as Direct Die Connect (DDC) packaging, Chip-on-Flex (COF) packaging, or any other type of packaging technology well known in the art of microelectronic fabrication. In the embodiment illustrated by FIG. 2, the IC 210 is mounted to the substrate 220 using flip chip technology where an active surface of the IC 210 is bonded directly to conductive traces on the substrate using an array of minute solder bumps 215.

The substrate 220 itself may be comprised of laminates such as FR-4, fiberglass or bismaleimide-triazine (BT) material, of coated aluminum, ceramic, or other suitable materials and multiple conductive layers including power (Vcc) planes 232, 234, and 236 and ground (Vss) planes 231, 233, 235, and 237 which are laminated or co-fired between the varied dielectric layers. In a departure from a conventional substrate, the substrate 220 of the embodiment illustrated by FIG. 2 includes a break 240 in the multiple conductive layers 231, 232, 233, etc. that corresponds to the horizontal break 205 in the IC 210. The break 240 in the conductive power planes 231, 232, 233, etc., enables burn-in of one portion 250 of the IC 210 while leaving the portion 260 of the IC 210 that is not powered unaffected by the burn-in. Pins 270 and 280 are attached to corresponding power supplies or signal generators (not shown in this view) and supply power to each portion 250 and 260 of the IC 210 using circuit paths 272, 274, 282, and 284 which transverse through the multiple conductive layers 231, 232, 233, etc. on each side of the break 240 in the substrate 220. In this manner, the microelectronic device 200 is designed so that the pins 270 and 280 can supply power to individual portions 250 and 260 of the IC 210 during a rotational burn-in (i.e., one side at a time). Thus, during burn-in the powered portion 250 of the IC 210 does not affect the portion 260 of the IC 210 that is not powered and vice versa. The IC 210 must be designed such that each side can function independently when in burn-in mode.

Figure 3:
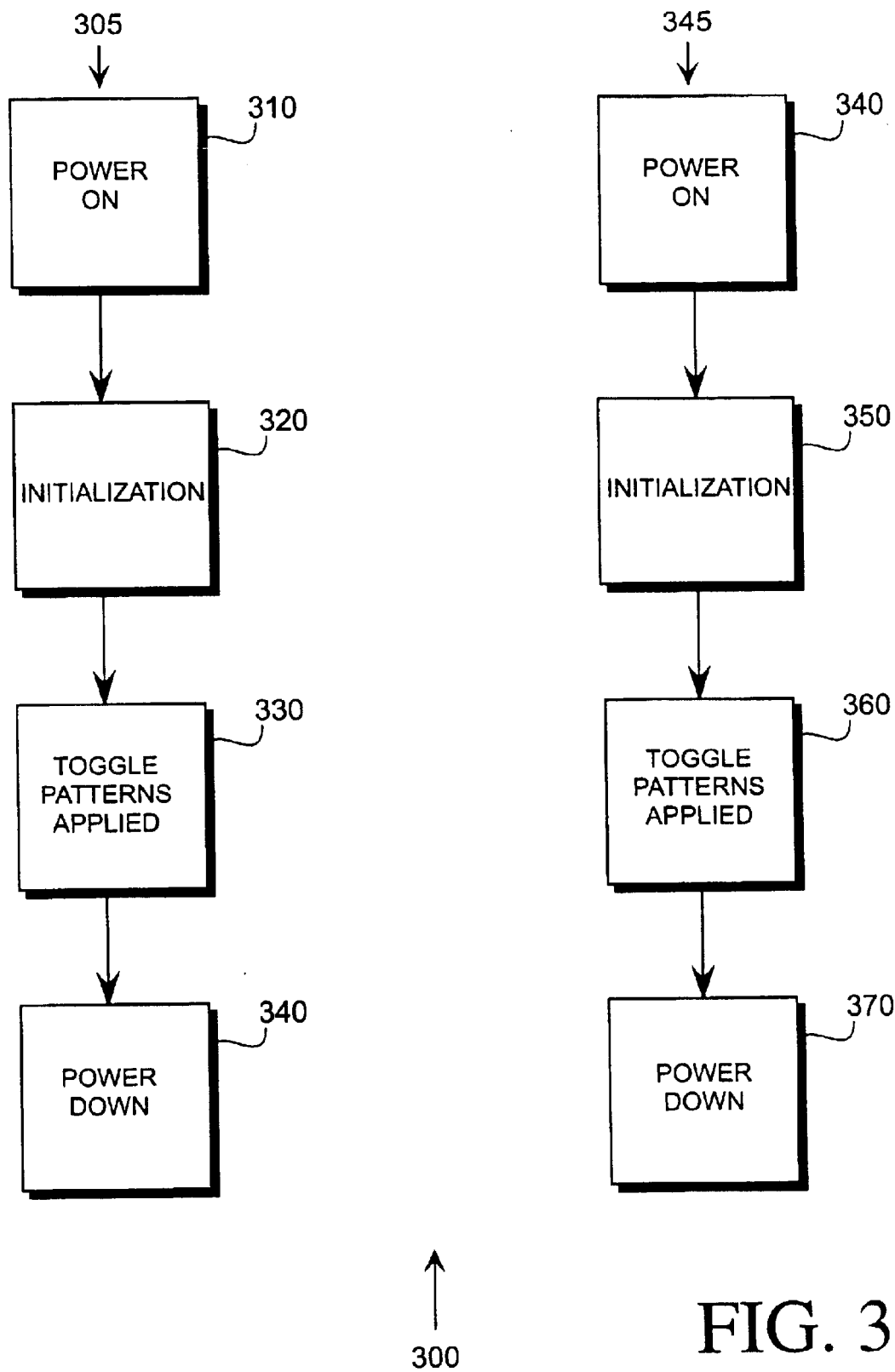
FIG. 3 is a flow chart of one embodiment of an operational burn-in sequence for the integrated circuit shown in FIG. 2.

Referring now to FIG. 3 there is shown a flow chart of one embodiment of an operational burn-in sequence 300 for the IC shown in FIG. 2. In the operational burn-in sequence illustrated by FIG. 3, there are two portions 250 and 260 of an IC 210 to burn-in separately. The first half of the operational burn-in sequence 300 is shown and designated as 305 and the second half of the operational burn-in sequence is shown and designated as 345. It should be appreciated, however, that this operational burn-in sequence may be used on an IC 210 with multiple portions to burn-in separately. The burn-in sequence begins on the first portion 250 of the microelectronic device 200 when the IC 210 is heated to the burn-in temperature and a test voltage is implemented (processing block 310). The first portion of the IC 210 is then initialized (processing block 320). At this point of the burn-in, a stress mode is activated putting the IC 210 in the desired configuration for stress. Toggle patterns are then applied to the first portion 250 of the IC 210 (processing block 330) for a designated time period during the burn-in. For example, a checkerboard pattern of alternating logic one and logic zero signals (usually 5 volts alternating with zero volts) are applied to the IC 210 as is well known in the art. After implementing the burn-in on the first portion 250 of the IC 210 (processing block 340) the second portion 260 of the IC 210 is subjected to a test voltage (processing block 360). No pre-heat is required since this occurred during burn-in on the first portion 250. The second portion 260 of the IC 210 is then initialized (processing block 370) and the appropriate toggle patterns are applied (processing block 380). The operational burn-in sequence 300 is repeated as necessary. As indicated above, the total stress time for burn-in generally ranges from 3–100 hours for the IC 210. However, this time frame is flexible. Moreover, although the checkerboard pattern of alternating logic ones and logic zero signals is utilized in the embodiment illustrated by FIG. 3, it should be appreciated that any toggle pattern may be employed (e.g., including all ones and all zeros, etc.).

Thus, a system and method for split package power and rotational burn-in of a microelectronic device has been described. Although the foregoing description and accompanying figures discuss and illustrate specific embodiments, it should be appreciated that the present invention is to be measured only in terms of the claims that follow.

What is claimed:

1. A method, comprising:
    providing a microelectronic device including an integrated circuit mounted to a substrate;
    providing a break through conductive layers of the substrate corresponding to a break in power planes of the integrated circuit;
    conducting burn-in on a first portion of the integrated circuit while a second portion of the integrated circuit remains unpowered; and
    conducting burn-in on the second portion of the integrated circuit while the first portion of the integrated circuit remains unpowered.

2. The method of claim 1 wherein providing the microelectronic device including the integrated circuit mounted to the substrate further comprises providing an integrated circuit with a dual core design.

3. The method of claim 2 wherein providing the integrated circuit with the dual core design does not affect the functioning of the integrated circuit.

4. The method of claim 1 wherein providing the microelectronic device including the integrated circuit mounted to the substrate further comprises providing electrical connections between the integrated circuit and the substrate.

5. The method of claim 1 wherein providing the break through the conductive layers of the substrate corresponding to the break in the power planes of the integrated circuit enables the burn-in of a first portion of the integrated circuit while a second portion of the integrated circuit remains unpowered.

6. The method of claim 1 wherein providing the break through the conductive layers of the substrate corresponding to the break in the power planes of the integrated circuit enables the burn-in of a second portion of the integrated circuit while a first portion of the integrated circuit remains unpowered.

7. The method of claim 1 wherein providing the break through the conductive layers of the substrate corresponding to the break in the power planes of the integrated circuit further comprises providing a first pin coupled to a first power supply to burn-in the first portion of the integrated circuit and a second pin coupled to a second power supply to burn-in the second portion of the integrated circuit.

8. The method of claim 7 wherein providing the first pin coupled to the first power supply to burn-in the first portion of the integrated circuit and the second pin coupled to the second power supply to burn-in the second portion of the integrated circuit comprises using circuit paths which transverse the conductive layers of the substrate.

9. The method of claim 1 further comprising heating the first portion of the integrated circuit to a burn-in temperature and implementing a test voltage.

10. The method of claim 9 further comprising initializing the first portion of the integrated circuit.

11. The method of claim 10 further comprising applying toggle patterns to the first portion of the integrated circuit for a designated time.

12. The method of claim 11 further comprising powering down the first portion of the integrated circuit to burn-in the second portion of the integrated circuit.

13. The method of claim 12 further comprising initializing the second portion of the integrated circuit.

14. The method of claim 13 further comprising applying toggle patterns to the second portion of the integrated circuit for a designated time.

15. The method of claim 14 further comprising powering down the second portion of the integrated circuit.

* * * * *